United States Patent [19]

Butler et al.

[11] Patent Number: 5,532,970
[45] Date of Patent: Jul. 2, 1996

[54] NO LATENCY PIPELINE

[76] Inventors: Edward Butler, P.O. Box 12, Richmond, Vt. 05477; Martin B. Lundberg, 175 Jackson Rd., Milton, Vt. 05468; Pushkar U. Mokashi, 941 Golden Grove Dr., Lewisville, Tex. 75067; Alfred L. Sartwell, P.O. Box 40, Skyview Dr., Jericho, Vt. 05465; Hemen R. Shah, 35 Thasha La., Apt. A7, Essex Jct., Vt. 05452; Robert Tamlyn, 10 Starbird Rd., Jerico, Vt. 05465

[21] Appl. No.: 398,334

[22] Filed: Mar. 3, 1995

[51] Int. Cl.$^6$ .................................................. G11C 8/00
[52] U.S. Cl. ................... 365/230.05; 365/193; 365/221; 365/230.08; 365/236
[58] Field of Search ............................. 365/221, 230.05, 365/193

[56] References Cited

U.S. PATENT DOCUMENTS 4,706,076  11/1987  Racchini .
4,858,190  8/1989   Yamaguchi et al. ............... 365/189.05
5,042,014  8/1991   Pinkham et al. ................... 365/230.05

*Primary Examiner*—David C. Nelms
*Assistant Examiner*—F. Niranjan
*Attorney, Agent, or Firm*—Eugene I. Shkurko

[57] ABSTRACT

An apparatus and method for enhancing serial access memory (SAM) performance incorporating a pipeline technique that removes a first bit clock cycle latency. In a video DRAM (VDRAM) read operation, accessed VDRAM data is provided simultaneously to the SAM and to a primary latch. The first bit of the VDRAM data is moved from the primary latch to a secondary output port of the memory apparatus ahead of the second through $n^{th}$ bits of the SAM data.

8 Claims, 6 Drawing Sheets

BLOCK DIAGRAM OF READ WITH INVENTION

BLOCK DIAGRAM OF READ WITHOUT INVENTION

FIRST BIT FLOW DIAGRAM WITHOUT THE INVENTION

BLOCK DIAGRAM OF READ WITH INVENTION

FIRST BIT FLOW DIAGRAM WITH THE INVENTION

TIMING WITH THE INVENTION.

NO LATENCY PIPELINE

This application claims priority under 35 U.S.C. § 120 as a continuation-in-part application of related U.S. patent application Ser. No. 08/362,086, filed Dec. 22, 1994, entitled "HIGH PERFORMANCE EXTENDED DATA OUT" now U.S. Pat. No. 5,490,114.

FIELD OF THE INVENTION

This invention relates in general to computer storage systems, more particularly to systems that require high bandwidth frame buffers, wherein a plurality of VDRAMs (Video Dynamic Random Access Memory) with Secondary Port Serial Access Memory are facilitated, for example, those requiring the updating and refreshing of video display devices at high performance rates. This invention improves the performance of stored data read operations.

BACKGROUND OF THE INVENTION

Computer graphics display systems, e.g. Graphics Workstations, are used to generate and display two dimensional and three dimensional images for the scientific and engineering community, film industry, and other disciplines. These graphics images are digitally represented and stored in a frame buffer that is comprised of a plurality of VDRAMS arranged in an array fashion. The rate at which the digital information stored in the frame buffer can be accessed is a critical parameter in the performance of the image rendering.

Most DRAMs store the digital information in a two dimensional array of cells arranged in rows and columns. Rows are referred to as Wordlines and columns as Bitlines. A cell can be uniquely addressed by selecting its associated Wordline and Bitline. The DRAM supports both a read and write operation to each cell (other operations are supported but are not relevant to the present invention). Both operations require a row address presented on the address input pins during a RAS (Row Address Strobe), and a column address presented on the address pins during a CAS (Column Address Strobe). The state of the WE (Write Enable) pin is evaluated to determine if a read or a write operation is to be performed. For a read operation, the row address is decoded to determine the wordline vector. The selected wordline cell's polarity is presented on a bitline which is connected to a primary sense amplifier that amplifies and latches the cell data. The column address is decoded and the associated bitline is presented to a data line, which transfers the data to a secondary sense amplifier, whose output is latched in a hold latch. The data is then processed to the OCD (Off Chip Driver), which presents data to tile output pins of the DRAM.

A write operation parallels the read operation until the column address decoding. At this point, new data is asserted on the Data In pins and write drivers transfer the new data to the data lines, over-writing the sense amplifiers and rewriting the new data into the cells.

A VDRAM is a derivative of the conventional DRAM with additional video features including a serial-out/parallel-in register connected to a Secondary Serial Port. This secondary port allows asynchronous scanout of the VDRAM data independent of the conventional DRAM primary data port read and write operation described above. The serial-out/parallel-in register, conventionally referred to as a SAM (Serial Access Memory), is connected to tile DRAM memory array such that a wordline S data can be read into the SAM in parallel fashion and data can be read from the SAM serially by initiating a clock cycle.

VDRAM scanout performance can be improved by increasing the Secondary Port access cycle time and by optimizing the associated circuitry. This method improves performance until the clock cycle period becomes shorter than the time required to fetch data from the Serial Register and present it to the Secondary Port data out pins. Under this condition valid data is not available since it fails to appear at the secondary port output pins before the next clock cycle.

SUMMARY OF THE INVENTION

Decreasing the clock cycle period for accessing a SAM is limited by the amount of time required to process and access the SAM data. Pipeline techniques have been used to overcome this limitation, but this technique can be further improved by removing from it the limitation commonly referred to as clock cycle latency. The present invention teaches a means of incorporating a pipeline technique that enhances SAM access performance.

The present invention comprises a memory system which may be incorporated in a VDRAM chip. The system includes an array of addressable memory cells, a serial-out/parallel-in register commonly referred to as a SAM, RAS and CAS decoding for selecting a memory cell, cell data latching and processing, data transfer from the array to a SAM, and primary and secondary data ports to present data externally to a computer or graphics system.

A first embodiment of this invention is a data storage device including a memory array for storing digital data and a SAM serial port for outputting the SAM data. Control logic is used for initiating a read operation in response to control and/or data signals originating externally from the storage device. The read operation would include decoding a row address strobe (RAS) and a column address strobe (CAS). Decoders are coupled to the control logic, and to the memory array for decoding the CAS and the RAS, and for accessing data in the memory array according to addresses supplied by the RAS and CAS. The data is passed to a transfer circuit coupled to the SAM and to a primary latch. A counter is incremented to address a second bit of the retrieved data. A secondary latch coupled to the SAM receives the SAM stored data starting with tile bit addressed by the counter. A first bit latch coupled to the primary latch receives a first bit of the retrieved data and passes it to a current bit latch coupled to both the secondary latch and tile secondary port off-chip driver.

A second embodiment of this invention is a method for circumventing a first bit clock latency during data retrieval in a DRAM device having serial access memory (SAM), a primary port, and a secondary port. During a transfer cycle from a memory array to the SAM, the normally disabled primary data path is utilized. The first bit transferred is propagated through the primary data path and is latched in a first bit latch. During this cycle the SAM counter is incremented one count beyond the start address of the transferred data. The serial clock initiates the SAM processing of the second transferred data bit to the secondary data latch (SDL) while the first bit latch transfers its bit to the current bit latch (CBL). Then the CBL data is moved to the driver, the second data bit in the SDL moves to the CBL, and the SAM processes the third bit into the SDL. This process is repeated until the SAM is empty.

In yet another aspect a computer graphics system is disclosed having a means of asserting a stimulus to the VDRAM. A processor generates address and control signals for accomplishing the processing of data to and from the VDRAM.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
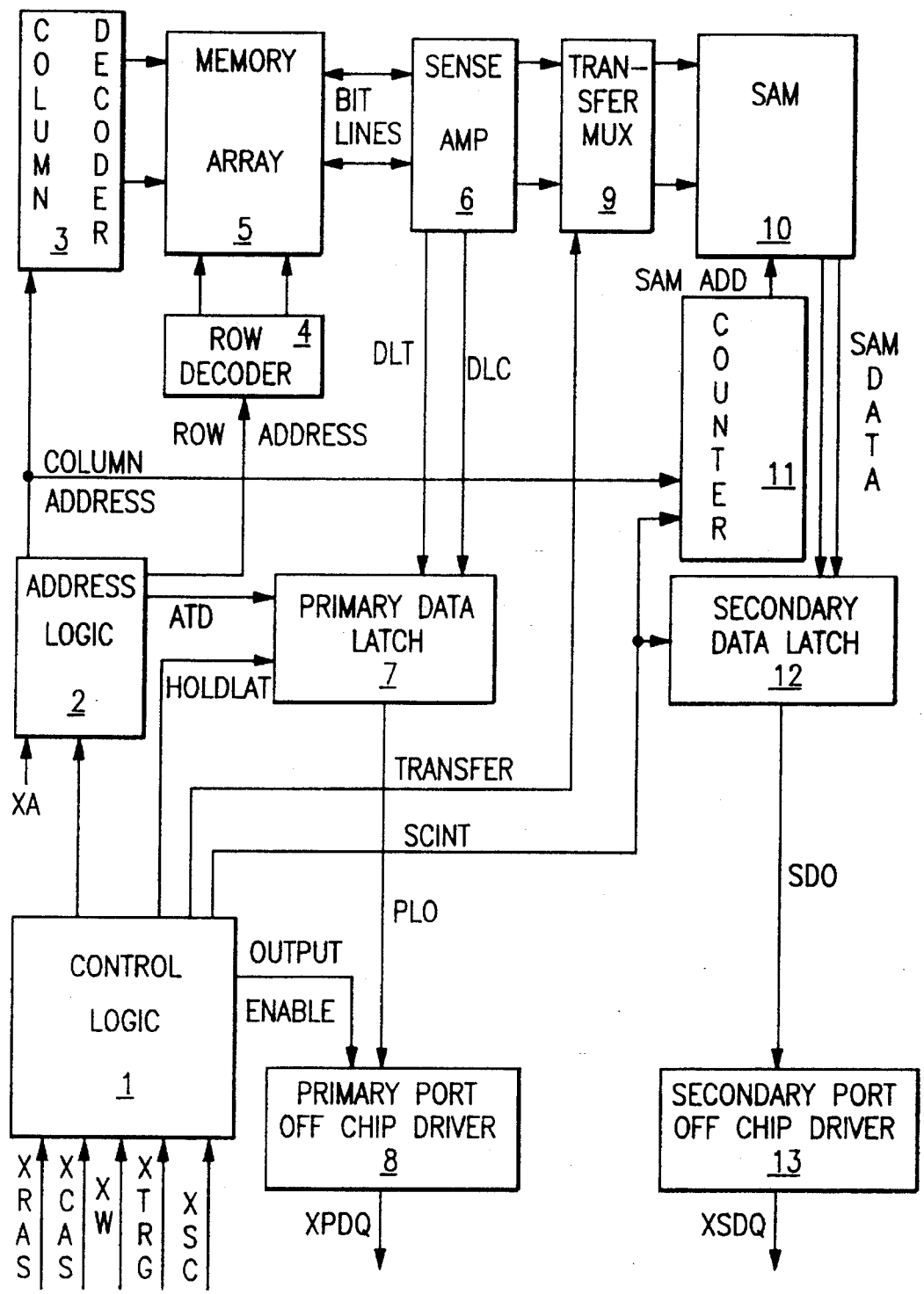
FIG. 1 is a block diagram illustrating the prior art SAM functional path.
Figure 2:
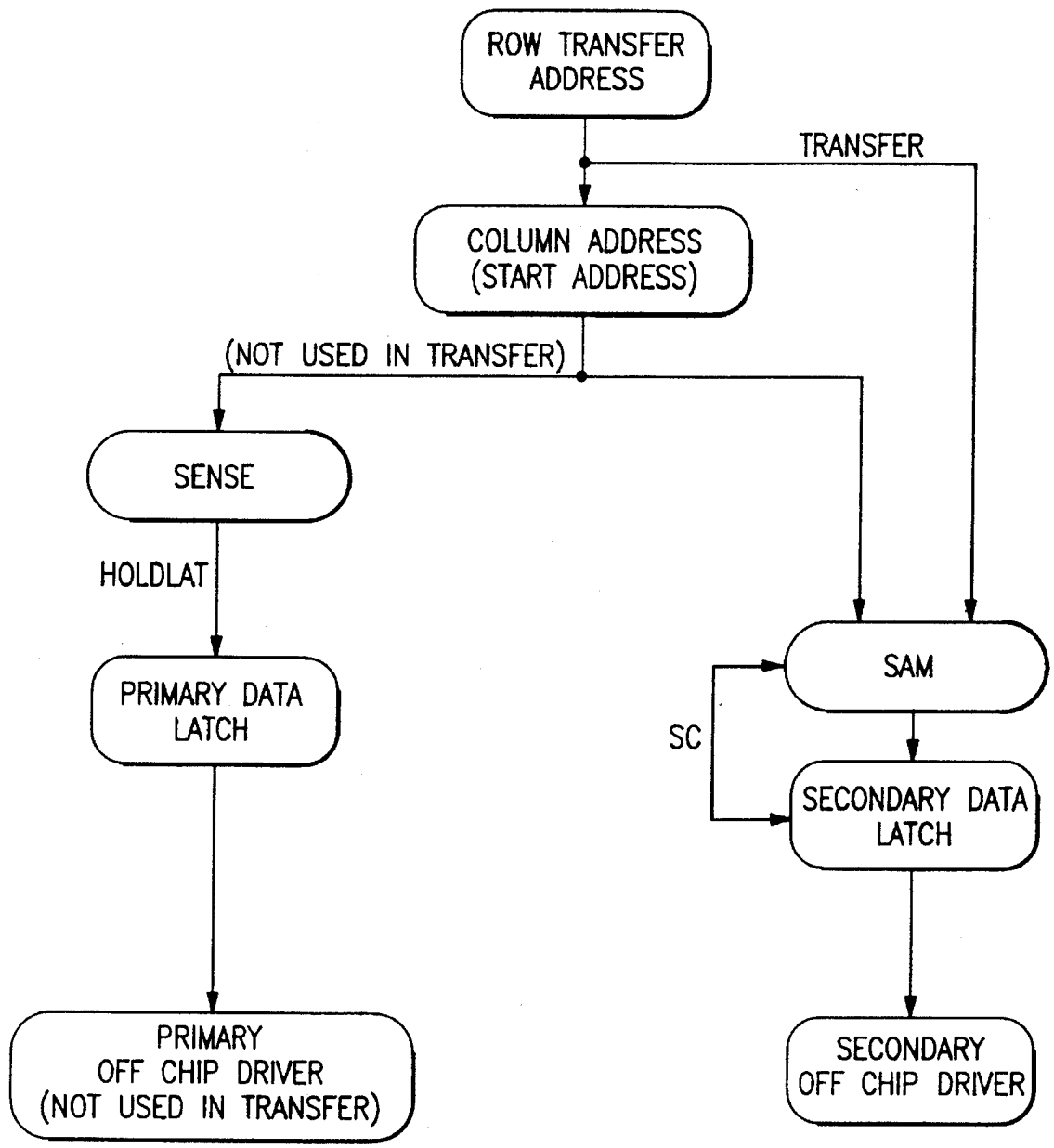
FIG. 2 is a flow chart representation of the prior art s processing of data to and out of the SAM.

An overall view of a prior art VDRAM device is shown in FIG. 1. The VDRAM Secondary Port placement is also depicted. A flow chart of the Secondary Port prior art process is presented in FIG. 2 and can also be referred for the following. Control Logic 1 interprets the state of the input pins XRAS, XCAS, XW, XSC, and XTRG, where X denotes a signal generated externally to the VDRAM. The polarity of these signals determines the SAM transfer directional state. The Address Logic 2 receives the presented RAS and CAS addresses which are decoded by the Row Decoder 4 and Column Decoder 3, respectively. A wordline and a bitline are selected, addressing a unique memory cell from the memory array 5.

For a SAM (Serial Access Memory) transfer, Transfer Mux 9 (Transfer Multiplex) is opened and a wordline s data from Memory Array 5 is transferred to the SAM 10 from the Sense Amp 6 (Sense Amplifier) in parallel fashion. Simultaneously the Column Address is loaded into Counter 11 for use as the first SAM address data bit.

SAM data is accessed by asserting the XSC (External Serial Clock) signal. Within the clock signal period the SAM data bit, pointed to by Counter 11, is processed to the Secondary Data Latch 12, then to the Secondary Port Off Chip Driver, and presented to the output data pins. Counter 11 is incremented and the next SAM Address is present awaiting the next XSC cycle.

For a primary port read operation the RAS and CAS addressing is processed as described above and the cell data is addressed. In this case the Control Logic 1 determines a primary read operation has been requested and the Memory Cell 5 cell data is processed to the Primary Data Latch 7, i.e. Transfer Mux 9 is held in the off state, and data is presented to the output data pins via the Primary Port Off Chip Driver 8.

Figure 3:
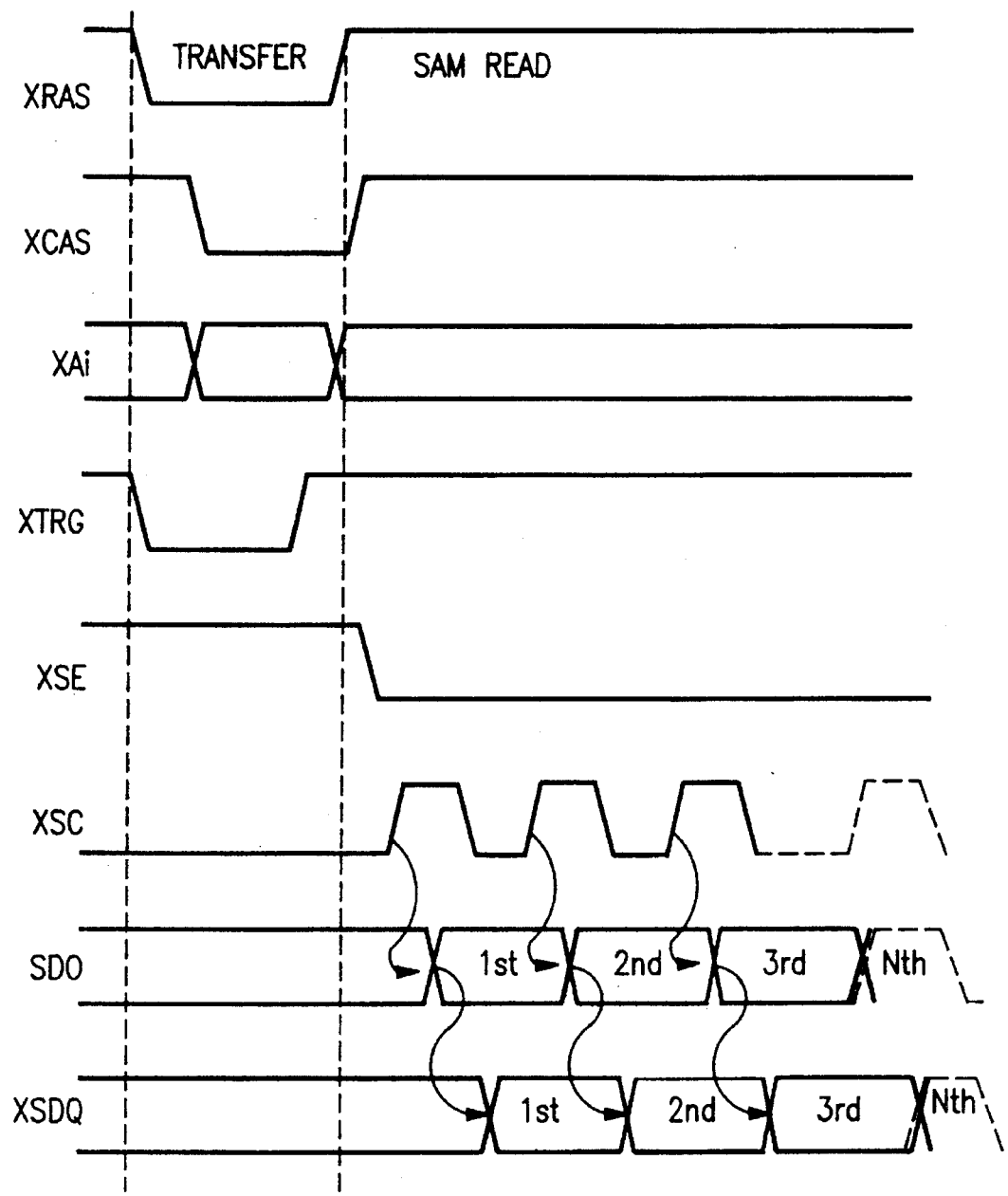
FIG. 3 is a signal waveform diagram illustrating the prior art transfer of data to the SAM and off chip processing.

FIG. 3 shows the timing waveforms for a conventional VDRAM transfer of data to the SAM and the accessing of said data from SAM. The Transfer operation is depicted and occurs when the XRAS, XCAS, and XTRG are active, i.e. low in the FIG. 3. XAi represents the valid column address that is used for the start address of the SAM. XSC cycles and SAM data is presented to the output pins, labeled as XSDQ. The accessing of a SAM bit occurs at the rising edge of XSC, the counter address is presented to the SAM, the SAM data is processed through the Secondary Data Latch 12, to the Secondary Port Off Chip Driver 13, driven to the output pins, and the counter is incremented. This process must occur within the XSC period. It should be noted that as the XSC frequency is increased, a threshold is attained that does not allow enough time to fetch and process the SAM data to the output pins.

Figure 4:
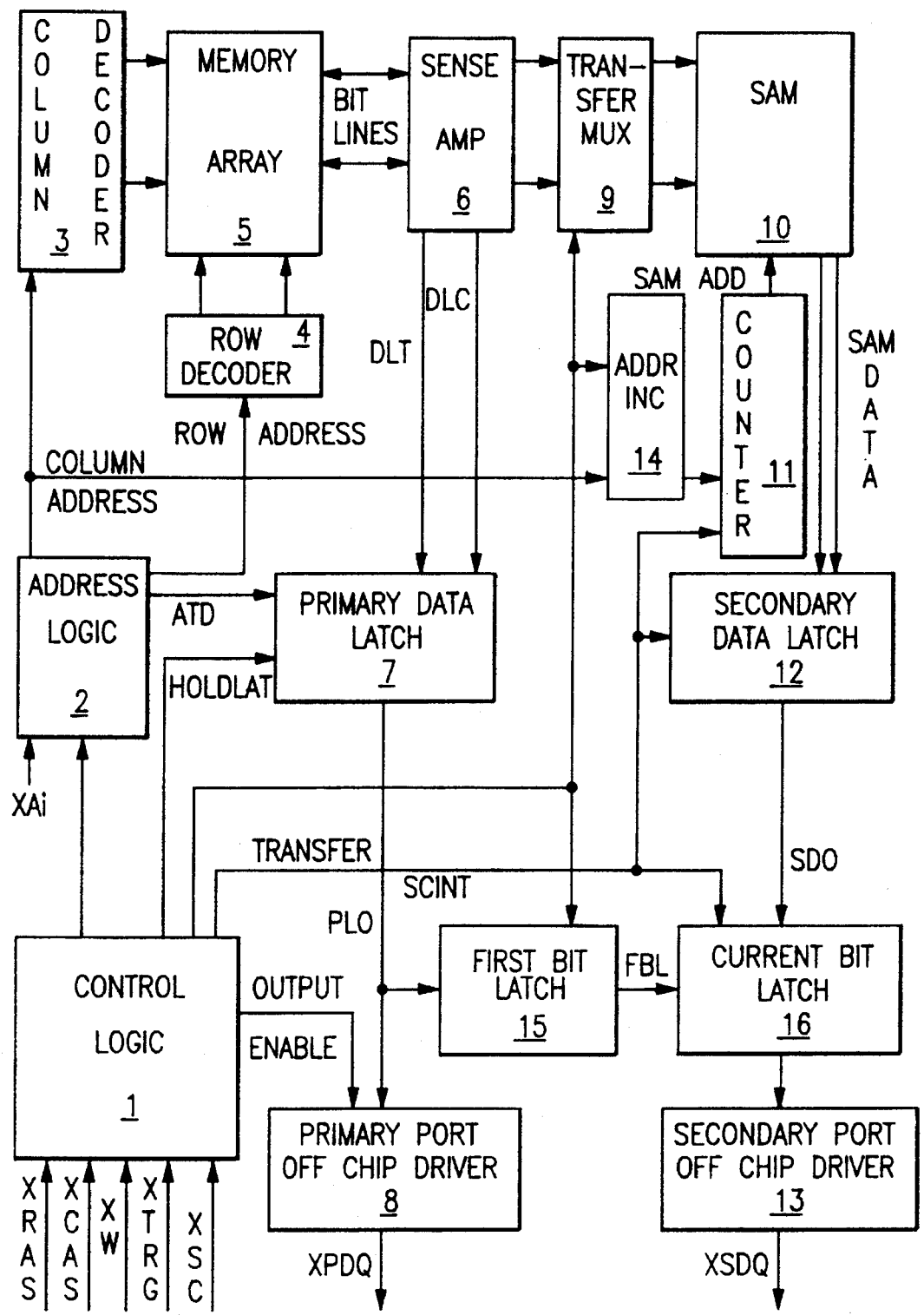
FIG. 4 is a block diagram illustrating the present invention SAM functional path.

One embodiment of Video Dynamic Random Access Memory in accordance with the present invention is presented in FIG. 4. The memory system includes a dynamic random Memory Array 5 consisting of memory cells in a row/column fashion, all of which are uniquely addressable. A Sense Amp(s) 6 amplifies and latches Read data; a Row Decoder 4 and Column Decoder 3 decodes the externally generated address provided to Address Logic 2; an input Control Logic 1 block determines a Read, Write, or Transfer state; a Transfer Mux 9 directs Memory Array 5 cell data to the SAM; data lines present the data to the Primary Data Latch 7; an Addr Inc 14 (Address Increment) increments the SAM start address by one; a Secondary Data Latch 12 holds SAM data; a Current Bit Latch 16 holds the current valid SAM data; a Secondary Port Off Chip Driver 13 presents SAM data to the output pins; and a First Bit Latch 15 connected to the primary port data path holds the SAM start address data.

Figure 5:
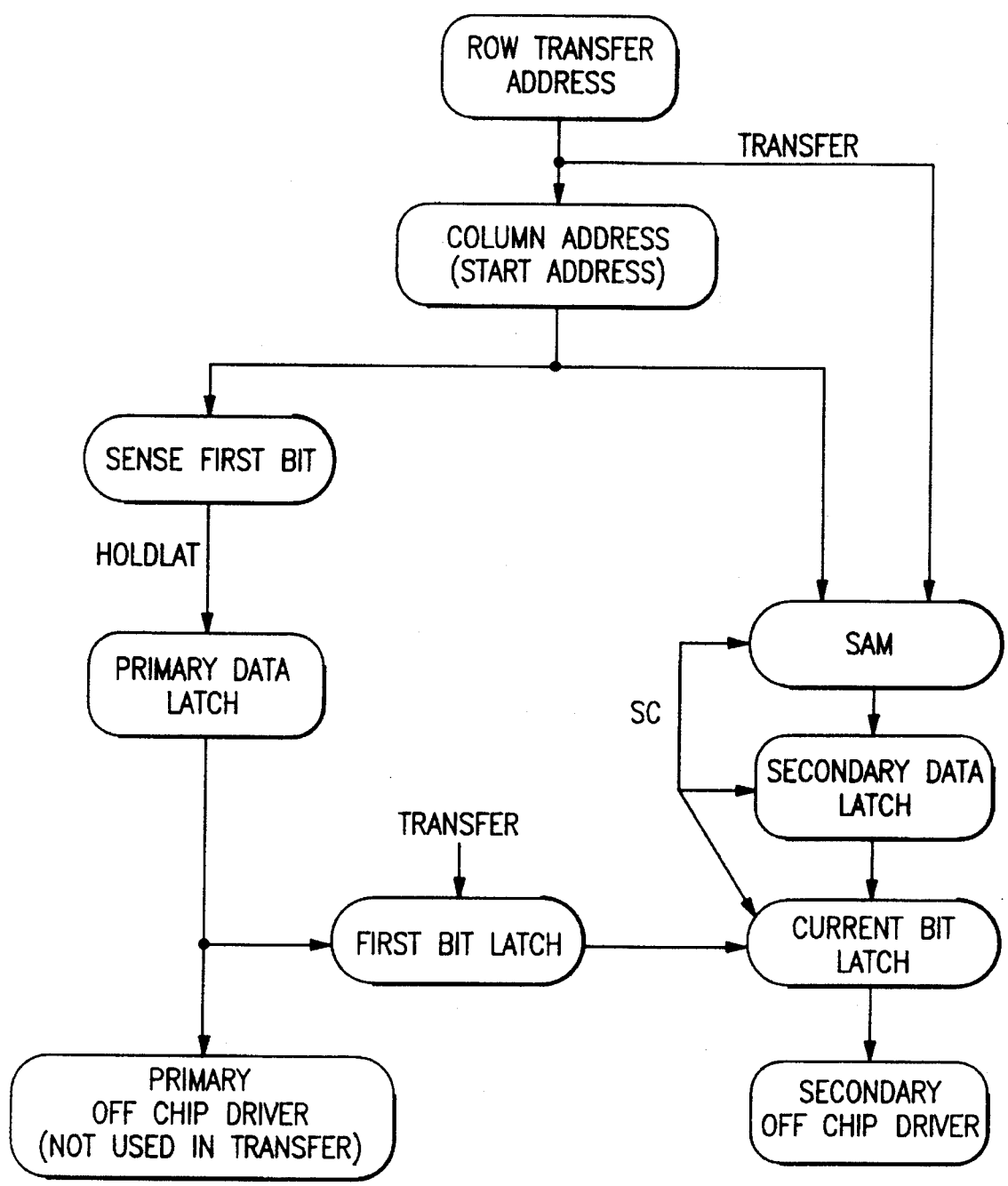
FIG. 5 is a flow chart representation of the present invention processing of data into and out of tile SAM.
Figure 6:
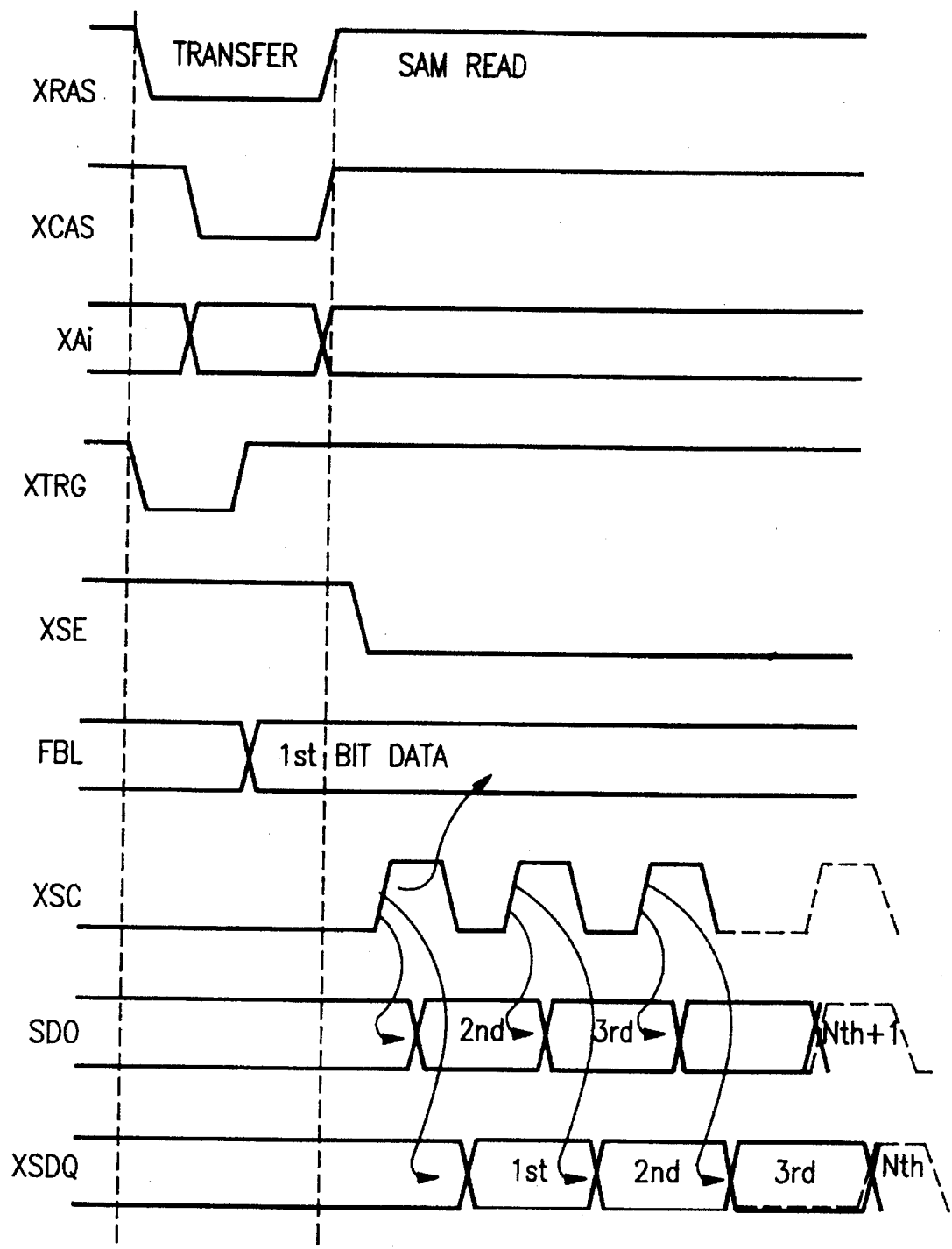
FIG. 6 is a signal waveform diagram illustrating the present invention transfer of data to the SAM and off chip processing.

FIG. 5 depicts the flow process of one embodiment of the present invention for using the primary data path to process the first data bit expected from the SAM. FIG. 6 shows a waveform timing diagram for this embodiment where a transfer operation is depicted with XRAS, XCAS, XAi, and XTRG in the active low state. During the transfer cycle, referring to FIG. 4, the Column address of the first SAM data bit is used to process Memory Array 5 cell data through the primary data path, DLC and DLT, to the First Bit Latch 15. Simultaneously the SAM is parallel loaded with the wordline data, and the SAM start address is first incremented by one in the Addr Inc 14 block and then loaded into the Counter 11.

Referring to FIG. 6, with the SAM transfer operation complete, the leading edge of XSC allows the SAM start address data (located in the first bit latch) to be moved to the Current Bit Latch, presented to the Secondary Off Chip Driver and to the output pins, thus eliminating the process time required to fetch the start address data from the SAM. Simultaneously, Counter 11 addresses the next SAM data bit, which is processed to the Secondary Data Latch. Then Counter 11 is incremented by one. The leading edge of the second cycle of the XSC signal processes the data from SDO to the Current Bit Latch and simultaneously fetches the next SAM data bit pointed to by the Counter 11. This process continues until a new transfer operation is requested, and then repeats.

Those skilled in the art will note from the above description that a high performance SAM access has been achieved using a pipeline technique that eliminates the conventional pipeline latency cycle incurred in a first access. This is accomplished by using the VDRAM primary data path, DLT and DLC of FIG. 6, as a means for processing the data bit for the SAM start address.

Alternative Embodiments

Although a specific embodiment has been described and illustrated above it is not limited to such. It is capable of numerous rearrangements, modifications and substitutions without departing from the scope of the invention. For example, while the discussion referred to VDRAM data processing, the invention is not limited to such. The technique can be implemented in any instance by using existing parallel paths, or creating such paths in a pipeline architecture.

We claim:

1. A data storage apparatus comprising:

a storage structure including a plurality of data cells for storing digital data;

control logic for initiating a read operation via data signals including a first access strobe (FAS);

decoder means coupled to the control logic, and to the storage structure for decoding the FAS, and for accessing data in the storage structure addressed by the FAS;

reading means coupled to the storage structure, to a transfer means, and to a primary latch for retrieving the accessed data, and for simultaneously providing the accessed data to the transfer means and to the primary latch, the transfer means for providing the retrieved data to a serial access memory (SAM);

counter increment means for incrementing a SAM counter so that a second bit of the retrieved data is addressed by the SAM counter;

a secondary latch coupled to the SAM for receiving a portion of the retrieved data from the SAM, the SAM providing said portion of the retrieved data beginning with a second bit of the retrieved data in response to the SAM counter;

a first bit latch coupled to the primary latch for receiving a first bit of the retrieved data, and for providing the first bit to a current bit latch, the current bit latch coupled to the secondary latch for receiving said portion of the retrieved data from the secondary latch immediately after receiving tile first bit of tile retrieved data from the first bit latch; and a secondary off-chip driver coupled to the current bit latch for providing the data received in tile current bit latch to hardware coupled to tile data storage apparatus.

2. The apparatus according to claim 1, wherein the first bit latch and the current bit latch is each coupled to the control logic and are activated by signals from the control logic.

3. A method for circumventing a first bit clock latency during data retrieval in a data storage device having serial access memory (SAM), the method comprising tile steps of:

(a) providing a row access strobe (RAS) to a memory array for accessing memory array data;

(b) simultaneously sending the accessed memory array data to the SAM and to a first data latch;

(c) sending a first bit of the accessed memory array data from the first data latch to a second data latch coupled to an off chip driver; and (d) immediately after step (c) sending the second through $n^{th}$ bits of the accessed data from the SAM to the second data latch coupled to the off chip driver.

4. The method according to claim 3, further comprising the step of:

incrementing a SAM counter to address a second bit of the accessed memory array data.

5. A data storage apparatus comprising:

a data storage structure;

hardware for reading data from the data storage structure and sending the data to a first signal path and to a second signal path;

a first port coupled to the hardware via the first signal path for outputting in a first format data sent by the hardware to the first signal path, the first signal path including first latch means;

a second port coupled to the hardware via the second signal path for outputting in a second format data sent by the hardware to the second signal path, the second signal path including a serial access memory (SAM) having a SAM counter;

a third signal path coupled to the first and second signal paths for sending from the first signal path to the second signal path at least one bit from a beginning of the data sent to the first signal path; and the SAM, in response to a SAM counter increment, removing said at least one bit from a beginning of the data sent to the second signal path and transmitting a remainder of the data sent to the second signal path so that said at least one bit from the beginning of the data sent to the first signal path replaces said at least one bit removed by the SAM and immediately precedes through the second port the remainder of the data sent to the second signal path.

6. The data storage apparatus according to claim 5, wherein the third signal path includes a first bit latch.

7. A data storage apparatus comprising:

a data storage structure;

hardware for reading data from the data storage structure and sending the data to a first signal path and to a second signal path;

a first port coupled to the hardware via the first signal path for outputting in a first format data sent by the hardware to the first and second signal paths, the first signal path including means for reformatting the data sent to the first signal path, the means for reformatting the data sent to the first signal path including means for removing at least one bit from a beginning of the data sent to the first signal path and for sending a remainder of the data to the first port; and the second signal path including means for appending at least one bit of the data message sent to the second signal path to the remainder of the data before it is output through the first port.

8. A computer system comprising:

a memory array including a plurality of data cells for storing digital data;

control logic for initiating a read operation, in response to received control and address signals, via data signals including a row address strobe (RAS) and a column address strobe (CAS);

a processor for providing the control and address signals to the control logic;

decoder means coupled to the control logic, and to the memory array for decoding the CAS and the RAS, and for accessing data in the memory array addressed by the RAS and CAS;

reading means coupled to the memory array, to a transfer means, and to a primary latch means for retrieving the accessed data, and for simultaneously providing the accessed data to the transfer means and to the primary latch means, the transfer means for providing the retrieved data to serial access memory (SAM);

counter increment means for incrementing a SAM counter so that a second bit of the retrieved data is addressed by the SAM counter;

secondary latch means coupled to the SAM for receiving a portion of the retrieved data from the SAM, the SAM providing the retrieved data beginning with a second bit of the retrieved data in response to the SAM counter;

first bit latch means coupled to the primary latch means for receiving a first bit of the retrieved data, and for providing the first bit to a current bit latch, the current bit latch coupled to the secondary latch means for receiving the second and remaining bits of the retrieved data from the secondary latch means immediately after receiving the first bit of the retrieved data from the first bit latch means; and secondary off-chip driver means coupled to the current bit latch for providing the data received in the current bit latch to hardware coupled to the data storage apparatus.

* * * * *